(12) United States Patent
Tromp et al.

(10) Patent No.: US 12,085,432 B2
(45) Date of Patent: Sep. 10, 2024

(54) METHOD FOR DETERMINING A LIQUID PORTION OF A FLOWING MEDIUM WITH A NUCLEAR MAGNETIC FLOWMETER

(71) Applicant: KROHNE AG, Basel (CH)

(72) Inventors: Rutger Reinout Tromp, Dordrecht (NL); Lucas Matias Ceferino Cerioni, Dordrecht (NL)

( * ) Notice: Subject to any disclaimer, the term of this patent is extended or adjusted under 35 U.S.C. 154(b) by 0 days.

(21) Appl. No.: 17/661,393

(22) Filed: Apr. 29, 2022

(65) Prior Publication Data

US 2022/0349737 A1   Nov. 3, 2022

(30) Foreign Application Priority Data

Apr. 30, 2021   (DE) .................... 10 2021 111 162.5

(51) Int. Cl.
*G01F 1/716* (2006.01)
*G01F 1/58* (2006.01)
(Continued)

(52) U.S. Cl.
CPC ............... *G01F 1/716* (2013.01); *G01F 1/58* (2013.01); *G01F 1/74* (2013.01); *G01N 24/082* (2013.01); *G01R 33/448* (2013.01)

(58) Field of Classification Search
CPC .. G01F 1/716; G01F 1/58; G01F 1/74; G01N 24/082; G01R 33/448
See application file for complete search history.

(56) References Cited

U.S. PATENT DOCUMENTS 5,410,248 A    4/1995 Dumoulin
5,825,186 A *  10/1998 Ehman ............. G01R 33/56358
                                                    324/309
(Continued)

FOREIGN PATENT DOCUMENTS

EP   2910907 A1   8/2015
GB   2279754 A    1/1995
(Continued)

OTHER PUBLICATIONS

M Appel et al.; Robust Multi-Phase Flow Measurement Using Magnetic Resonance; SPE Middle East Oil and Gas Show and Conference held in Manama. Bahrain, Sep. 25-28, 2011; Copyright 2011; Society of Petroleum Engineers Technology; 20 pages.

*Primary Examiner* — Peter J Macchiarolo
*Assistant Examiner* — John M Royston
(74) *Attorney, Agent, or Firm* — Patrick Duplessis

(57) ABSTRACT

A method for determining a liquid portion of a flowing medium with a nuclear magnetic flowmeter includes: generating a gradient magnetic field in a measuring tube volume of the flowmeter; exposing the medium to the gradient magnetic field and a magnetic field generated by a magnetizing device of the flowmeter; generating and irradiating an excitation signal into the magnetized medium for exciting nuclear magnetic resonances therein; measuring nuclear magnetic resonances excited by the excitation signal in the magnetized medium as a measuring signal; determining frequencies of the nuclear magnetic resonances in the measuring signal; assigning the determined frequencies to positions along a first gradient direction in the measuring tube volume; assigning the nuclear magnetic resonances at the positions to liquid and gaseous portions of the medium; and determining a liquid portion of the medium in the measuring tube volume from the positions of the nuclear magnetic resonances.

17 Claims, 3 Drawing Sheets

(51) Int. Cl.
*G01F 1/74* (2006.01)
*G01N 24/08* (2006.01)
*G01R 33/44* (2006.01)

(56) References Cited

U.S. PATENT DOCUMENTS

| | | |
|---|---|---|
| 5,936,405 A | 8/1999 | Prammer et al. |
| 6,046,587 A | 4/2000 | King et al. |
| 6,268,727 B1 | 7/2001 | King et al. |
| 2004/0008027 A1 | 1/2004 | Prammer |
| 2012/0092006 A1* | 4/2012 | Li ..................... G01R 33/563 |
| | | 324/306 |
| 2013/0193969 A1* | 8/2013 | Grunewald ............. G01V 3/14 |
| | | 324/309 |
| 2015/0234026 A1 | 8/2015 | Hogendoorn et al. |
| 2016/0313159 A1 | 10/2016 | Appel et al. |
| 2017/0241821 A1* | 8/2017 | Tromp ............ G01R 33/56308 |
| 2017/0328755 A1* | 11/2017 | Cerioni ................ G01R 33/307 |
| 2018/0017700 A1* | 1/2018 | Shin ........................ E21B 49/08 |
| 2018/0313926 A1 | 11/2018 | Hogendoorn et al. |

FOREIGN PATENT DOCUMENTS

| | | |
|---|---|---|
| WO | 9859220 A2 | 12/1998 |
| WO | 2015088888 A1 | 6/2015 |

* cited by examiner

METHOD FOR DETERMINING A LIQUID PORTION OF A FLOWING MEDIUM WITH A NUCLEAR MAGNETIC FLOWMETER

TECHNICAL FIELD

The invention relates to a method for determining a liquid portion of a flowing medium using a nuclear magnetic flowmeter. The nuclear magnetic flowmeter comprises a measuring tube with a measuring volume, a measuring device and a magnetizing device. The medium is made to flow through the measuring tube and has both a liquid portion and a gaseous portion. A magnetic field is generated along a magnetic field direction in the measuring volume by the magnetizing device and the medium is magnetized by the magnetic field. This means that the medium is exposed to and magnetized by the magnetic field when flowing through the measuring volume.

BACKGROUND

The invention is in the field of nuclear magnetic flowmeters. The measuring device of a nuclear magnetic flowmeter is adapted to carry out measurements on a medium flowing through the measuring volume of the measuring tube and to determine information about the medium from the measurements. When a measurement is carried out by the measuring device, a precession of atomic nuclei of the medium in the presence of the magnetic field that has previously magnetized the medium is affected by exciting the atomic nuclei to nuclear magnetic resonances, and the nuclear magnetic resonances are measured. A nuclear magnetic resonance can occur, for example, in the form of a Free Induction Decay (FID) or a spin echo. Such measurements are also called magnetic resonance measurements.

Precession is a property of atomic nuclei of elements that exhibit nuclear spin. The nuclear spin can be conceived as an angular momentum describable by a vector and, correspondingly, the magnetic moment caused by the nuclear spin can also be described by a vector parallel to the vector of the angular momentum. The presence of a macroscopic magnetic field causes an excess of atomic nuclei with magnetic moments in a medium that are aligned parallel to the macroscopic magnetic field, resulting in the medium having a macroscopic magnetization that can be described in its entirety by a vector. The vector of the magnetic moment of an atomic nucleus precesses about the vector of the macroscopic magnetic field at the location of the atomic nucleus in the presence of a macroscopic magnetic field. This is the property precession. The frequency of precession is called the Larmor frequency $f_L$ and is proportional to the magnitude of the magnetic flux density B of the macroscopic magnetic field. The Larmor frequency is calculated according to $f_L=(\gamma/2\pi) B$. In this, $\gamma$ is the gyromagnetic ratio, which is maximum for hydrogen nuclei. The Larmor frequency will also be referred to simply as the frequency in the following.

These magnetic moments and precessions are affected by electromagnetic pulses, which exert a torque on the magnetic moments and thereby rotate the magnetic moments by angles subtracted between the magnetic moment vector and the macroscopic magnetic field. When pulses are mentioned in the following, such pulses are meant.

Since the medium has a liquid and a gaseous portion, it also has at least two phases. Thus, the medium is a multi-phase medium. For example, the gaseous portion is one phase and is the liquid portion another phase. Often the liquid portion also has more than one phase, for example the phases crude oil and (salt) water. The gaseous phase is, for example, natural gas.

In order to determine information about the individual phases of the multi-phase medium, atomic nuclei of the individual phases must be excitable to distinguishable nuclear magnetic resonances. For example, nuclear magnetic resonances are distinguishable from each other if spin-lattice relaxations of the individual phases have different spin-lattice relaxation time constants $T_1$ from each other. The spin-lattice relaxation time constant is a property of a phase. Other properties include a spin-spin relaxation time constant $T_2$ and a diffusion time constant D. Using at least one of the listed properties, information about phases of the medium can be determined. Information is, for example, flow rates of individual phases of the medium through the measuring tube and a liquid portion of the medium in the measuring tube. Information about individual phases also includes properties of the phases.

The phases crude oil, (salt) water and natural gas have already been mentioned. These are also the main phases of a multi-phase medium extracted from an oil well. Since the atomic nuclei of all these phases have hydrogen nuclei and usually especially the phases crude oil and (salt) water are characterized by different spin-lattice relaxation time constants $T_1$, nuclear magnetic flowmeters are particularly suitable for determining information of media produced from oil wells.

One important piece of information is the aforementioned liquid portion of the medium in the measuring volume of the measuring tube, also known as the pipe filling factor or liquid hold-up. The liquid portion is, for example, the quotient of the volume occupied by the liquid portion in the measuring volume as the dividend and the measuring volume as the divisor. The measuring volume is completely occupied by the volume of the liquid portion and the volume of the gaseous portion. It is known from the prior art to determine the liquid portion by first exciting a nuclear magnetic resonance in the entire liquid portion of the medium in the measuring volume by an excitation signal and then measuring this as a measuring signal. Then an amplitude of the measuring signal is determined and the liquid portion is derived from the amplitude. This way of determining the liquid portion has several disadvantages.

One disadvantage is that the gaseous portion can also be excited to a nuclear magnetic resonance by the excitation signal and this can then also be measured, so that it is present in the measuring signal and increases the amplitude and thus falsifies it.

Another disadvantage is that the nuclear magnetic resonance cannot be measured immediately after the excitation signal, but only after it has subsided, since otherwise the excitation signal falsifies the measuring signal. When determining the liquid portion from the amplitude, the amplitude at the time of the excitation signal must be determined, which requires extrapolation from the time of measurement to the time of excitation. Various effects must be taken into account in this extrapolation. For example, it must be taken into account that the magnetized medium with the nuclear magnetic resonance flows out of the measuring volume at a velocity. Further, it has to be taken into account that the nuclear magnetic resonance decreases due to relaxation effects described, for example, by the spin-spin relaxation time constant $T_2$. Thus, the accuracy of the extrapolation depends on the accuracy of the knowledge of the velocity and spin-spin relaxation time constants. There are additional effects that affect the accuracy of the extrapolation.

Another disadvantage is that inaccuracies in the knowledge of the magnetization of the medium in the measuring volume lead to a corresponding inaccuracy of the amplitude and thus of the liquid portion.

SUMMARY

Therefore, one object of the invention is to provide a method which at least mitigates one of the listed disadvantages.

The object is achieved by a method with the disclosed features.

Namely, in a gradient step, a gradient magnetic field with a strength gradient along a first gradient direction is generated in the measuring volume by the magnetization device, and the medium is exposed to the gradient magnetic field in addition to the magnetic field. Accordingly, the flowing medium in the measuring volume is simultaneously exposed to both the magnetic field and the gradient magnetic field.

Further, the following measuring steps are carried out by the measuring device:

Generating and irradiating an excitation signal into the magnetized medium in the measuring volume for exciting nuclear magnetic resonances in the magnetized medium along the first gradient direction. Due to the gradient magnetic field, the excited nuclear magnetic resonances differ from each other along the first gradient direction.

Measuring nuclear magnetic resonances excited by the excitation signal in the magnetized medium along the first gradient direction in the measuring volume as one measuring signal. Thus, nuclear magnetic resonances in the medium previously excited by the excitation signal are measured.

Determining frequencies of the nuclear magnetic resonances in the measuring signal along the first gradient direction. Determining the frequencies includes, for example, Fourier transforms. Due to the superposition of the magnetic field, with the gradient magnetic field, the frequencies according to $f_L=(\gamma/2\pi)$ B depend on a position of the medium along the first gradient direction. B is the magnetic flux density resulting from the superposition of the magnetic field and the gradient magnetic field. An infinitesimally thin disc of the medium in the measuring volume, oriented orthogonally to the first gradient direction, exhibits a frequency. For example, if a strength of the gradient magnetic field increases in the first gradient direction, then the frequencies in the first gradient direction in the discs of the medium also increase according to the gyromagnetic ratio.

The measurement steps are carried out while the flowing medium is substantially in the measuring volume.

Then, the following evaluation steps are carried out by the measuring device:

Assigning the determined frequencies to positions along the first gradient direction. The positions are assigned, for example, thin discs of the medium in the measuring volume arranged orthogonally to the first gradient direction, wherein the discs are thin such that a frequency is assigned to each of them.

Assigning the nuclear magnetic resonances at the positions to the liquid portion and to the gaseous portion of the medium. Since the individual phases of the medium and thus also the liquid and gaseous portions of the medium are excited to distinguishable nuclear magnetic resonances, the nuclear magnetic resonances at the positions can also be assigned to either the liquid or the gaseous portion of the medium. The assignment of the nuclear magnetic resonances to the liquid and gaseous portions is preferably carried out by evaluating a strength of the nuclear magnetic resonances, such as amplitudes. A strength of a nuclear magnetic resonance of the liquid portion is greater than a strength of a nuclear magnetic resonance of the gaseous portion.

Determining a liquid portion of the flowing medium in the measuring volume from the positions of the nuclear magnetic resonances of the liquid portion and the positions of the nuclear magnetic resonances of the gaseous portion. During determination, the measuring volume, in particular its geometry, is also taken into account.

The method according to the invention for determining the liquid portion at least mitigates the disadvantages pointed out before. There is no unintentional excitation of nuclear magnetic resonances in the gaseous portion. The fact that a nuclear magnetic resonance cannot be measured immediately after the excitation signal, but only after the resonance, has no negative effects. Also, inaccuracies in the knowledge of the magnetization of the medium do not lead to falsifications of the liquid portion.

In a first design of the method, the measuring tube is oriented horizontally and the first gradient direction is oriented vertically. The specifications horizontal and vertical refer to the gravity field vector. A horizontal orientation is perpendicular to the gravity field vector and a vertical orientation is parallel to it. The horizontal orientation of the measuring tube causes horizontal stratification of the liquid and gaseous portions in the measuring tube by gravity. Due to the vertical orientation of the first gradient direction, planes perpendicular to the first gradient direction pass through the positions along the first gradient direction, which are also horizontal. Because the liquid and gaseous portions of the medium are horizontally layered and the planes are also horizontally oriented, a more precise determination of a transition between the liquid and gaseous portions occurs.

The magnetic field has a certain homogeneity and in this sense is homogeneous. This means that the magnetic field exhibits small fluctuations. For example, the magnetic field has a magnetic flux density of 0.2 T and the fluctuations are 1000 ppm. This results in a frequency uncertainty of $\Delta f_L=(\gamma/2\pi)$ $\Delta B$=42.58 MHz/T·0.2 T·1000 ppm=8.5 kHz. For example, the gradient magnetic field has a strength gradient of G=0.25 mT/cm. The frequency uncertainty then corresponds to a spatial uncertainty of $\Delta d=\Delta B/G$=0.8 cm. If the measuring tube has an inner diameter of, for example, 10 cm and the first gradient direction coincides with it, then the location uncertainty of 0.8 cm corresponds to a precision of 0.8 cm/10 cm=8%.

To implement a required precision, in a further design of the method, a homogeneity of the magnetic field is determined and a strength for the strength gradient is determined based on the determined homogeneity and a required precision along the gradient direction. Preferably, the required precision is within 10%, more preferably within 5%, and especially preferably within 1% of a distance along the gradient direction in the measuring volume. Preferably, the homogeneity of the magnetic field is determined by the magnetization device. The distance along the gradient direction is, for example, a diameter of the measuring tube.

In a further design, the excitation signal comprises at least one excitation pulse. An excitation pulse irradiated into the magnetized medium in the measuring volume excites nuclear magnetic resonances in the magnetized medium along the first gradient direction. For this, the excitation pulse must have a determined bandwidth. The bandwidth is preferably determined in such a way that an excitation pulse completely excites the medium along the first gradient direction in the measuring volume to nuclear magnetic resonances. Further, in one design, a bandwidth for the at least one excitation pulse is determined by the magnetization device based on a homogeneity of the magnetic field and a strength of the strength gradient. Preferably, the at least one excitation pulse is generated for rotating magnetic moments of the magnetized medium by angles between 5° and 45° and more preferably by angles of 90°. Preferably, a hard, a soft, an adiabatic, a CHIRP or a WURST pulse is used as the at least one excitation pulse.

An excitation pulse usually does not excite nuclear magnetic resonances having different frequencies from each other with the same efficiency. Accordingly, the efficiency of excitation of nuclear magnetic resonances is frequency dependent. As a result, nuclear magnetic resonances of different frequencies also have different strengths, which is a disadvantage in the evaluation steps. Therefore, in a further development of the above design, it is provided that a strength of the nuclear magnetic resonances is determined by the magnetization device with respect to their frequencies and that the strength of the nuclear magnetic resonances is normalized with respect to their frequencies so that a frequency-dependent efficiency of the excitation of the nuclear magnetic resonances by the at least one excitation pulse is compensated.

In a further design, it is provided that the excitation signal comprises at least one refocusing pulse. A refocusing pulse, which is irradiated into the magnetized medium in the measuring volume, refocuses a previously excited nuclear magnetic resonance. Preferably, the at least one refocusing pulse is generated for rotating magnetic moments of the magnetized medium by angles of 45° and more preferably by angles of 180°. Preferably, a hard, a soft, an adiabatic, a CHIRP or a WURST pulse is used as the at least one refocusing pulse.

In a further design, the excitation signal has a multi-echo pulse sequence and nuclear magnetic resonances excited in the magnetized medium are measured and evaluated by the multi-echo pulse sequence. A multi-echo pulse sequence has at least one excitation pulse and at least one refocusing pulse, preferably at least two refocusing pulses. The measuring signal exhibits the nuclear magnetic resonances excited by the multi-echo pulse sequence in the magnetized medium. By using the multi-echo pulse sequence, the measuring signal exhibits more information than is needed to determine the liquid portion. Preferably, the nuclear magnetic resonances excited by the multi-echo pulse sequence in the magnetized medium are evaluated by determining at least one flow rate of the magnetized medium. Thus, further evaluation steps are carried out. Thus, the evaluation yields, on the one hand, the liquid portion and, on the other hand, in this example, a flow rate. Preferably, a CPMG, an SSFP or an MMME pulse sequence is used as the multi-echo pulse sequence. CPMG stands for Carr-Purcell-Meiboom-Gill, SSFP stands for Steady-State-Free-Precession, and MMME stands for Multiple-Modulation-Multiple-Echoes.

In a further design, the excitation signal has an excitation pulse followed by a refocusing pulse and a spin echo excited by the refocusing pulse is measured. Preferably, the refocusing pulse is generated for rotating magnetic moments in the magnetized medium by angles of 180°.

In a further design, the excitation signal has a CPMG pulse sequence and the excitation pulse and the refocusing pulse are a part of the CPMG pulse sequence. While the excitation pulse and the refocusing pulse cause the information in the measuring signal that enables the liquid portion to be determined, the portions of the CPMG pulse sequence that go beyond this cause further information in the measuring signal that can be evaluated. Accordingly, in the further development it is also provided that nuclear magnetic resonances excited by the CPMG pulse sequence are measured and evaluated. In particular, the nuclear magnetic resonances are evaluated by determining at least one flow rate of the magnetized medium. Thus, further evaluation steps are carried out by the measuring device.

In a further design, the excitation signal comprises a first excitation pulse followed by a first refocusing pulse and a second refocusing pulse followed by a second excitation pulse. The second excitation pulse is used to compensate for any remaining nuclear magnetic resonances. Further, a spin echo is measured between the first refocusing pulse and the second refocusing pulse as a measuring signal or as a part of the measuring signal. Preferably, the second excitation pulse has a phase shift of 180° with respect to the first excitation pulse. This part of the measuring signal has the information for determining the liquid portion.

In a further development of the above design, the excitation signal has a CPMG pulse sequence and the CPMG pulse sequence follows the second excitation pulse. Between the second excitation pulse and the CPMG pulse sequence, the gradient magnetic field is reduced, preferably reduced to zero. Further, nuclear magnetic resonances excited by the CPMG pulse sequence are measured and evaluated, in particular evaluated by determining at least one flow rate of the magnetized medium. The nuclear magnetic resonances excited by the CPMG pulse sequence are a further part of the measuring signal and thus further evaluation steps are carried out by the measuring device.

In an alternative further development of the above design, the excitation signal has an MMME pulse sequence and the MMME pulse sequence follows the second excitation pulse. Between the second excitation pulse and the MMME pulse sequence, the gradient magnetic field is first reduced to zero and then increased again in a second gradient direction. Preferably, the second gradient direction is oriented perpendicular to the first gradient direction, in particular parallel to a flow direction of the medium. Further, nuclear magnetic resonances excited by the MMME pulse sequence are measured and evaluated, in particular evaluated by determining at least one flow rate of the magnetized medium. The nuclear magnetic resonances excited by the CPMG pulse sequence are a further part of the measuring signal and thus further evaluation steps are carried out by the measuring device.

In a further design of the method, the gradient step is again carried out with a third gradient direction different from the first gradient direction. Then, the measurement steps and the evaluation steps are executed again. Further, a precision of the determination of the liquid portion is improved by combining the two determinations of the liquid portion. Preferably, the third gradient direction is perpendicular to the first gradient direction.

BRIEF DESCRIPTION OF THE DRAWINGS

In detail, a plurality of possibilities is given for designing and further developing the method. For this, reference is made to the following description of preferred embodiments in conjunction with the drawings.

DETAILED DESCRIPTION

Figure 1:
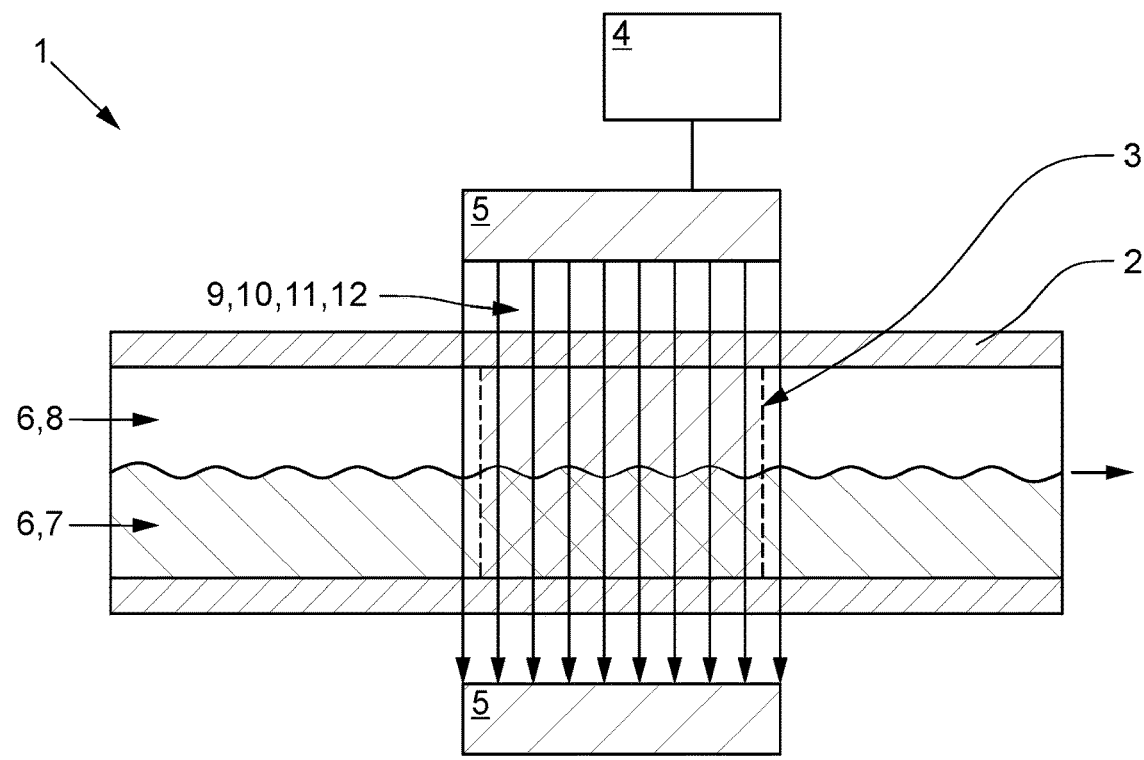
FIG. 1 illustrates an embodiment of a nuclear magnetic flowmeter for carrying out an embodiment of a method for determining a liquid portion.

FIG. 1 shows an embodiment of a nuclear magnetic flowmeter 1, which is designed to carry out the embodiment of a method for determining a liquid portion of a flowing medium described below. The representation of the nuclear magnetic flowmeter 1 is partially cut.

The nuclear magnetic flowmeter 1 has a measuring tube 2 with a measuring volume 3, a measuring device 4 and a magnetizing device 5. The measuring tube 2 is oriented horizontally.

The nuclear magnetic flowmeter 1 is in operation, therefore a medium 6 is flowing through the measuring tube 2. The flow and its direction are indicated by an arrow. The medium 6 has a liquid portion 7 and a gaseous portion 8. The liquid portion 7 is a phase and the gaseous portion 8 is another phase. The horizontal orientation of the measuring tube 2 causes horizontal stratification of the liquid portion 7 and the gaseous portion 8 in the measuring tube 2 by gravity. Further, the method described below is carried out by the nuclear magnetic flowmeter 1.

From the magnetization device 5, on the one hand, a magnetic field 9 is generated along a magnetic field direction 10 in the measuring volume 3 and, on the other hand, a gradient magnetic field 11 with a strength gradient is generated along a first gradient direction 12 in the measuring volume. The magnetic field direction 10 and the gradient field direction 12 are oriented parallel to each other and are perpendicular. In FIG. 1, a superposition of the magnetic field 9 and the gradient magnetic field 11 is shown. The medium 6 is exposed to both the magnetic field 9 and the gradient field 11 in the measuring volume 3, wherein it is magnetized by the magnetic field 9, so that nuclear magnetic measurements can be made on the magnetized medium 6.

The embodiments of the method described below each build on the steps carried out by the magnetization device 5 described above.

Figure 2:
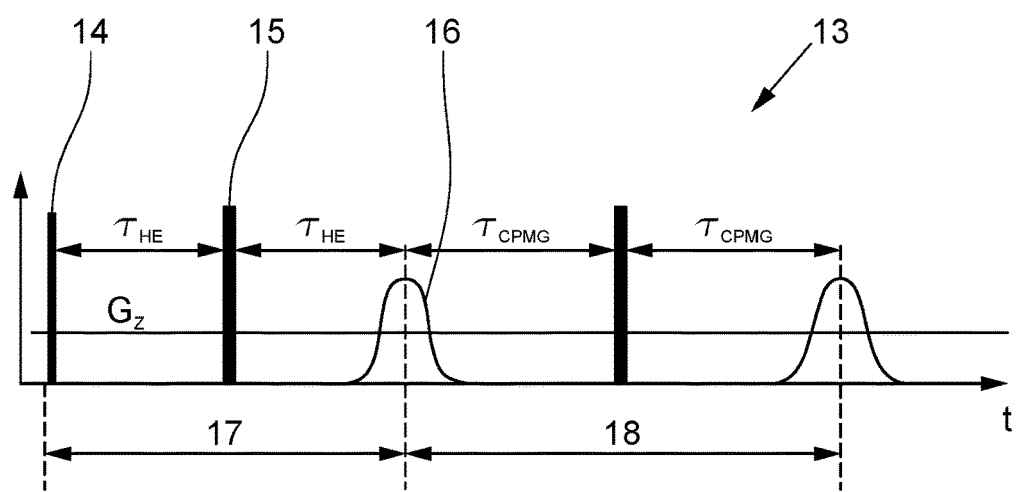
FIG. 2 illustrates a first embodiment of a signal sequence of the method.

In one embodiment, see FIG. 2, the measuring device 4 carries out the following steps:

Generating and irradiating an excitation signal into the magnetized medium 6 in the measuring volume 3 for exciting nuclear magnetic resonances in the magnetized medium 6 along the first gradient direction 12. The excitation signal comprises a CPMG pulse sequence 13 including an excitation pulse 14 and a refocusing pulse 15. The refocusing pulse 15 follows the excitation pulse 14. The refocusing pulse 15 is generated to rotate magnetic moments in the magnetized medium 6 by angles of 180°.

Measuring nuclear magnetic resonances excited by the excitation signal, i.e. the CPMG pulse sequence 13, in the magnetized medium 6 along the first gradient direction 12 in the measuring volume 3 as a measuring signal. In particular, a spin echo 16 excited by the refocusing pulse is measured.

Determining frequencies of the spin echo 16 along the first gradient direction 12.

Assigning the determined frequencies to positions along the first gradient direction 12.

Assigning the spin echo 16 at the positions to the liquid portion 7 and the gaseous portion 8 of the medium 6.

Determining a liquid portion of the flowing medium 6 in the measuring volume 3 from the positions of the spin echo 16 of the liquid portion 7 and the positions of the spin echoes 16 of the gaseous portion 8 of the medium 6. In the present case, the medium 6 flows laminarly and the liquid portion is 50%, see FIG. 1.

Determining a flow rate of the magnetized medium 6 from the measured nuclear magnetic resonances.

In a first section 17 the liquid portion is determined and in a second section 18 the flow rate is determined. Distances between the individual signals are denoted by $\tau_{HE}$ and $\tau_{CPMG}$. A strength of the gradient magnetic field is shown as $G_z$. Signals are, in particular, arbitrary excitation pulses, refocusing pulses, FIDs, and spin echoes.

Instead of the spin echo 16, a later spin echo can also be used to determine the liquid portion, which is excited by a later refocusing pulse. It is also possible to use an FID. However, determining the liquid portion with an FID is less accurate than with a spin echo.

A disadvantage of this embodiment is that the refocusing pulse 15 often has a lower bandwidth than the excitation pulse 14, which decreases a quality of the measuring signal.

Figure 3:
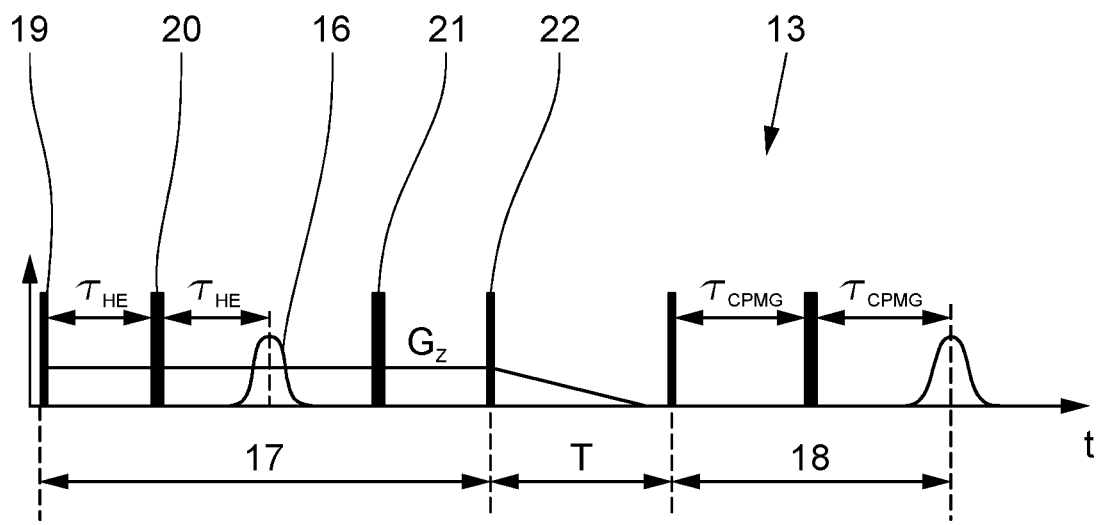
FIG. 3 illustrates a second embodiment of a signal sequence of the method.

In any case, this disadvantage is mitigated in a further embodiment, see FIG. 3. In this embodiment, the measuring device 4 carries out the following steps:

Generating and irradiating an excitation signal into the magnetized medium 6 in the measuring volume 3 for exciting nuclear magnetic resonances in the magnetized medium 6 along the first gradient direction 12. The excitation signal comprises a first excitation pulse 19 followed by a first refocusing pulse 20 and a second refocusing pulse 21 followed by a second excitation pulse 22 for compensating nuclear magnetic resonances still present. The second excitation pulse 22 has a phase shift of 180° with respect to the first excitation pulse 19. Further, the excitation signal has a CPMG pulse sequence 13 following the second excitation pulse 22, which may be different from that of the preceding embodiment. Between the second excitation pulse 22 and the CPMG pulse sequence 13, the gradient magnetic field 11 is reduced to zero. The strength of the gradient magnetic field 11 is shown as $G_z$ and the reduction to zero occurs within a time period T.

Measuring nuclear magnetic resonances excited by the excitation signal in the magnetized medium 6 along the first gradient direction 12 in the measuring volume 3 as a measuring signal. In particular, a spin echo 16 between the first refocusing pulse 20 and the second refocusing pulse 21 is measured as a part of the measuring signal.

Determining frequencies of the spin echo 16 along the first gradient direction 12.

Assigning the determined frequencies to positions along the first gradient direction 12.

Assigning the spin echo 16 at the positions to the liquid portion 7 and the gaseous portion 8 of the medium 6.

Determining a liquid portion of the flowing medium 6 in the measuring volume 3 from the positions of the spin echo 16 of the liquid portion 7 and the positions of the spin echo 16 of the gaseous portion 8 of the medium 6.

Determining a flow rate of the magnetized medium 6 from nuclear magnetic resonances excited by the CPMG pulse sequence 13, which are a part of the measuring signal.

In the first section 17, the determination of the liquid portion is carried out and in the second section 18, the determination of the flow rate is carried out, wherein the two sections are separated from each other by the time period T. Distances between the individual signals are denoted by $\tau_{HE}$ and $\tau_{CPMG}$.

Instead of the spin echo 16, a later spin echo can also be used here to determine the liquid portion, which is excited by a later refocusing pulse. It is also possible to use an FID.

A disadvantage of this embodiment is that many spin echoes are required to determine the flow rate with a CPMG pulse sequence, resulting in low temporal resolution and changes in the flow rate to be measured during the measurement leading to errors.

Figure 4:
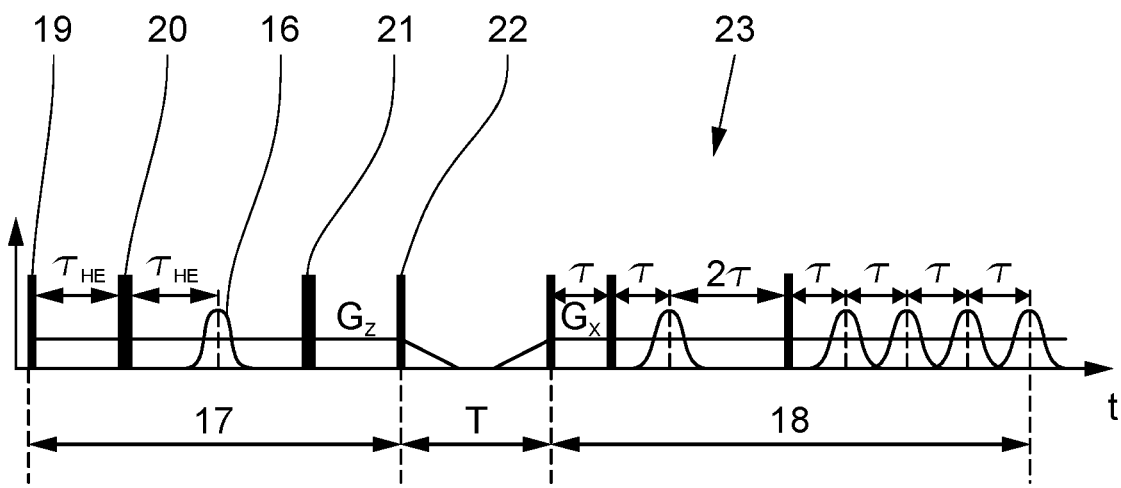
FIG. 4 illustrates a third embodiment of a signal sequence of the method.

In any case, this disadvantage is at least mitigated in another embodiment, see FIG. 4. In this embodiment, the measuring device 4 carries out the following steps:

Generating and irradiating an excitation signal into the magnetized medium 6 in the measuring volume 3 for exciting nuclear magnetic resonances in the magnetized medium 6 along the first gradient direction 12. The excitation signal comprises a first excitation pulse 19 followed by a first refocusing pulse 20 and a second refocusing pulse 21 followed by a second excitation pulse 22 for compensating nuclear magnetic resonances still present. The second excitation pulse 22 has a phase shift of 180° with respect to the first excitation pulse. Further, the excitation signal has an MMME pulse sequence 23 following the second excitation pulse 22. Between the second excitation pulse 22 and the MMME pulse sequence 23, the gradient magnetic field 11 is reduced to zero and then increased again in a second gradient direction. The second gradient direction is perpendicular to the first gradient direction 12 and is parallel to the flow of the medium 6. The strength of the gradient magnetic field 11 in the first gradient direction 12 is shown as $G_z$ and in the second gradient direction as $G_x$. The reduction to zero and the increase occur within a time period T.

Measuring nuclear magnetic resonances excited by the excitation signal in the magnetized medium 6 along the first gradient direction 12 in the measuring volume 3 as a measuring signal. In particular, a spin echo 16 between the first refocusing pulse 20 and the second refocusing pulse 21 is measured as a part of the measuring signal.

Determining frequencies of the spin echo 16 along the first gradient direction 12.

Assigning the determined frequencies to positions along the first gradient direction 12.

Assigning the spin echo 16 at the positions to the liquid portion 7 and the gaseous portion 8 of the medium 6.

Determining a liquid portion of the flowing medium 6 in the measuring volume 3 from the positions of the spin echo 16 of the liquid portion 7 and the positions of the spin echo 16 of the gaseous portion 8 of the medium 6.

Determining a flow rate of the magnetized medium 6 from nuclear magnetic resonances excited by the MMME pulse sequence, which are a part of the measuring signal. The time required for determining the flow rate with the MMME pulse sequence 23 is much less than with a CPMG pulse sequence.

In the first section 17, the liquid portion is determined and in the second section 18, the flow rate is determined, wherein the two sections are separated from each other by the time period T. Distances between the individual signals are indicated by $\tau_{HE}$ and $\tau$.

Instead of the spin echo 16, a later spin echo can also be used here to determine the liquid portion, which is excited by a later refocusing pulse. It is also possible to use an FID.

Figure 5:
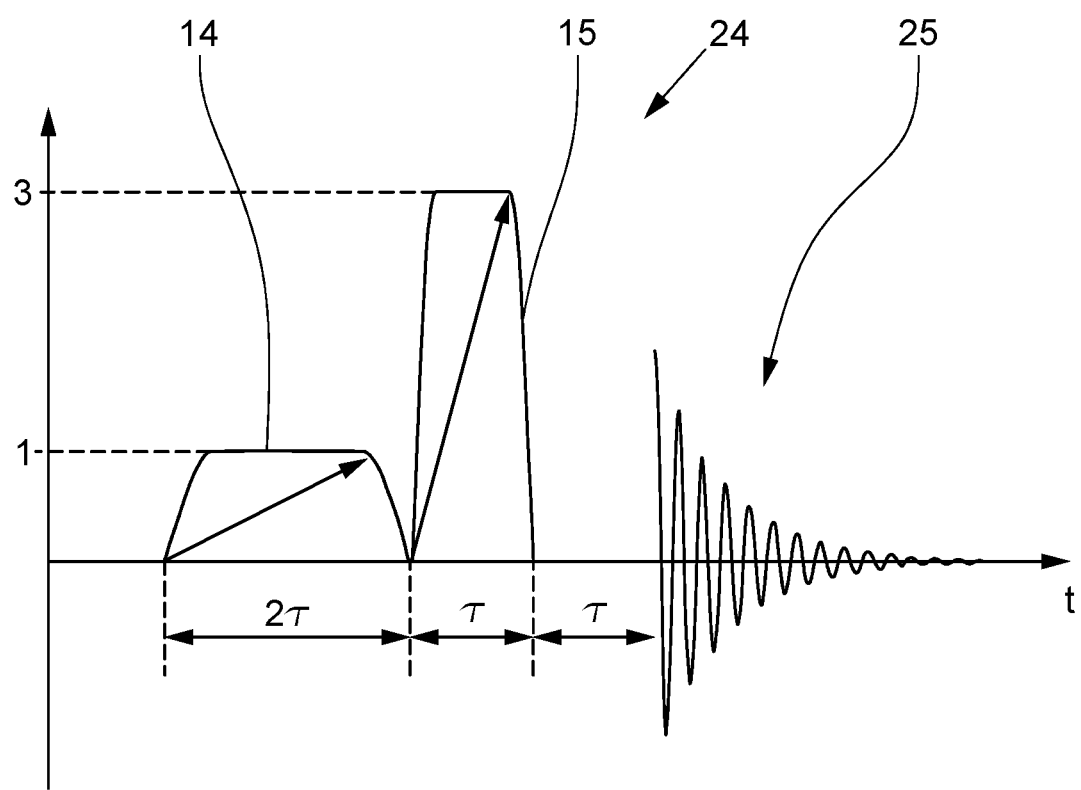
FIG. 5 illustrates a fourth embodiment of a signal sequence of the method.

In another embodiment, see FIG. 5, the measuring device 4 carries out the following steps:

Generating and irradiating an excitation signal into the magnetized medium 6 in the measuring volume 3 for exciting nuclear magnetic resonances in the magnetized medium 6 along the first gradient direction 12. The excitation signal has a CHIRP pulse sequence 24 with an excitation pulse 14 followed by a refocusing pulse 15. In FIG. 5, only the envelopes of the excitation pulse 14 and the refocusing pulse 15 are shown. The envelopes have the substantially rectangular shape common to hard pulses. A frequency of the excitation pulse 14 and a frequency of the refocusing pulse 15 increase during their respective durations, in this case linearly. While the excitation pulse 14 has a duration of $2\tau$ and a normalized amplitude of 1, the refocusing pulse 15 has a duration of $\tau$ and a normalized amplitude of 3.

Measuring an FID 25 excited by the excitation signal, i.e., the CHIRP pulse sequence, in the magnetized medium 6 along the first gradient direction 12 in the measuring volume 3 as a measuring signal. Here, the measurement is carried out a duration $\tau$ after the refocusing pulse 15 to avoid problems with dead times.

Determining frequencies of the FID 25 along the first gradient direction 12.

Assigning the determined frequencies to positions along the first gradient direction 12.

Assigning the FID 25 at the positions to the liquid portion 7 and the gaseous portion 8 of the medium 6.

Determining a liquid portion of the flowing medium 6 in the measuring volume 3 from the positions of the FID 25 of the liquid portion 7 and the positions FID 25 of the gaseous portion 8 of the medium 6.

FIGS. 2 to 5 show schematic extracts of signal sequences. This means, in particular, that in addition to the signals shown, other signals may also be included in the signal sequences. An explicit assignment of the described steps to the measuring and evaluation steps has not been made, but can be taken from the description preceding the embodiments.

In the above embodiments, reference is made to a spin echo from which the liquid portion is determined. These embodiments are further developed, for example, in that the determination of the liquid portion is carried out with multiple spin echoes, so that the determination is more reliable and/or accurate. The further spin echoes are generated by further refocusing pulses in the excitation signal.

The invention claimed is:

1. A method for determining a liquid portion of a flowing medium with a nuclear magnetic flowmeter, wherein the nuclear magnetic flowmeter includes a measuring tube with a measuring volume, a measuring device and a magnetizing device, wherein the medium is made to flow through the measuring tube and has a liquid portion and a gaseous portion, wherein a magnetic field is generated along a magnetic field direction in the measuring volume by the magnetizing device and the medium is magnetized by the magnetic field, the method comprising:

generating a gradient magnetic field with a strength gradient along a first gradient direction in the measuring volume by the magnetizing device;

exposing the medium to the gradient magnetic field in addition to the magnetic field;

carrying out the following measurement steps by the measuring device:

generating and irradiating an excitation signal into the magnetized medium in the measuring volume for exciting nuclear magnetic resonances in the magnetized medium along the first gradient direction;

measuring nuclear magnetic resonances excited by the excitation signal in the magnetized medium along the first gradient direction in the measuring volume as a measuring signal;

determining frequencies of the nuclear magnetic resonances in the measuring signal along the first gradient direction;

carrying out the following evaluation steps by the measuring device:

assigning the determined frequencies to positions along the first gradient direction;

assigning the nuclear magnetic resonances at the positions to the liquid portion and to the gaseous portion of the medium; and determining a liquid portion of the flowing medium in the measuring volume from the positions of the nuclear magnetic resonances of the liquid portion and the positions of the nuclear magnetic resonances of the gaseous portion of the medium;

wherein the excitation signal includes a first excitation pulse followed by a first refocusing pulse and a second refocusing pulse followed by a second excitation pulse for compensating for nuclear magnetic resonances still present;

wherein a spin echo is measured between the first refocusing pulse and the second refocusing pulse as a part of the measuring signal;

wherein the second excitation pulse has a phase shift of 180° with respect to the first excitation pulse;

wherein the excitation signal has a CPMG pulse sequence;

wherein the CPMG pulse sequence follows the second excitation pulse;

wherein, between the second excitation pulse and the CPMG pulse sequence, the gradient magnetic field is reduced to zero; and wherein nuclear magnetic resonances excited by the CPMG pulse sequence are measured and evaluated by determining at least one flow rate of the magnetized medium.

2. The method according to claim 1, wherein the measuring tube is oriented horizontally and the first gradient direction is oriented vertically.

3. The method according to claim 1, wherein a homogeneity of the magnetic field is determined based on a flux density of the magnetic field and a fluctuation of the magnetic field;

wherein a strength for the strength gradient is determined based on the determined homogeneity and a required precision along the gradient direction; and wherein the required precision is within 10% of a distance along the gradient direction in the measuring volume.

4. The method according to claim 1, wherein a bandwidth for at least one of the first excitation pulse and the second excitation pulse is determined by the magnetization device based on a homogeneity of the magnetic field and a strength of the strength gradient;

wherein at least one of the first excitation pulse and the second excitation pulse is generated for rotating magnetic moments of the magnetized medium by angles between 5° and 45° or by angles of 90°; and wherein a hard, a soft, an adiabatic, a CHIRP (24) or a WURST pulse is used for at least one of the first excitation pulse and the second excitation pulse.

5. The method according to claim 4, wherein a strength of the nuclear magnetic resonances with respect to their frequencies is determined by the magnetization device; and wherein the strength of the nuclear magnetic resonances with respect to their frequencies is normalized so that a frequency-dependent efficiency of the excitation of the nuclear magnetic resonances by at least one of the first excitation pulse and the second excitation pulse is compensated.

6. The method according to claim 1, wherein at least one of the first refocusing pulse and the second refocusing pulse is generated for rotating magnetic moments of the magnetized medium by angles of 45° or by angles of 180°; and wherein a hard, a soft, an adiabatic, a CHIRP (24) or a WURST pulse is used as at least one of the first refocusing pulse and second refocusing pulse.

7. The method according to claim 1, wherein the excitation signal includes a multi-echo pulse sequence;

wherein nuclear magnetic resonances excited by the multi-echo pulse sequence in the magnetized medium are measured and evaluated by determining at least one flow rate of the magnetized medium; and wherein the CPMG pulse sequence is used as the multi-echo pulse sequence.

8. The method according to claim 1, wherein at least one of the first refocusing pulse and the second refocusing pulse are generated for rotating magnetic moments in the magnetized medium by angles of 180°.

9. A method for determining a liquid portion of a flowing medium with a nuclear magnetic flowmeter, wherein the nuclear magnetic flowmeter includes a measuring tube with a measuring volume, a measuring device and a magnetizing device, wherein the medium is made to flow through the measuring tube and has a liquid portion and a gaseous portion, wherein a magnetic field is generated along a magnetic field direction in the measuring volume by the magnetizing device and the medium is magnetized by the magnetic field, the method comprising:

generating a gradient magnetic field with a strength gradient along a first gradient direction in the measuring volume by the magnetizing device;

exposing the medium to the gradient magnetic field in addition to the magnetic field;

carrying out the following measurement steps by the measuring device:

generating and irradiating an excitation signal into the magnetized medium in the measuring volume for exciting nuclear magnetic resonances in the magnetized medium along the first gradient direction;

measuring nuclear magnetic resonances excited by the excitation signal in the magnetized medium along the first gradient direction in the measuring volume as a measuring signal;

determining frequencies of the nuclear magnetic resonances in the measuring signal along the first gradient direction;

carrying out the following evaluation steps by the measuring device:

assigning the determined frequencies to positions along the first gradient direction;

assigning the nuclear magnetic resonances at the positions to the liquid portion and to the gaseous portion of the medium; and determining a liquid portion of the flowing medium in the measuring volume from the positions of the nuclear magnetic resonances of the liquid portion and the positions of the nuclear magnetic resonances of the gaseous portion of the medium;

wherein the excitation signal includes a first excitation pulse followed by a first refocusing pulse and a second refocusing pulse followed by a second excitation pulse for compensating for nuclear magnetic resonances still present;

wherein a spin echo is measured between the first refocusing pulse and the second refocusing pulse as a part of the measuring signal;

wherein the second excitation pulse has a phase shift of 180° with respect to the first excitation pulse;

wherein the excitation signal includes an MMME pulse sequence;

wherein the MMME pulse sequence follows the second excitation pulse;

wherein, between the second excitation pulse and the MMME pulse sequence, the gradient magnetic field is first reduced to zero and then increased again in a second gradient direction;

wherein the second gradient direction is perpendicular to the first gradient direction; and wherein nuclear magnetic resonances excited by the MMME pulse sequence are measured and evaluated by determining at least one flow rate of the magnetized medium.

10. The method according to claim 9, wherein the gradient step is carried out again with a third gradient direction different from the first gradient direction;

wherein the measurement steps and the evaluation steps are then carried out again;

wherein a precision of the determination of the liquid portion is improved by combining both determinations of the liquid portion; and wherein the third gradient direction is perpendicular to the first gradient direction.

11. The method according to claim 9, wherein the measuring tube is oriented horizontally and the first gradient direction is oriented vertically.

12. The method according to claim 9, wherein a homogeneity of the magnetic field is determined based on a flux density of the magnetic field and a fluctuation of the magnetic field;

wherein a strength for the strength gradient is determined based on the determined homogeneity and a required precision along the gradient direction; and wherein the required precision is within 10% of a distance along the gradient direction in the measuring volume.

13. The method according to claim 9, wherein a bandwidth for at least one of the first excitation pulse and the second excitation pulse is determined by the magnetization device based on a homogeneity of the magnetic field and a strength of the strength gradient;

wherein at least one of the first excitation pulse and the second excitation pulse is generated for rotating magnetic moments of the magnetized medium by angles between 5° and 45° or by angles of 90°; and wherein a hard, a soft, an adiabatic, a CHIRP (24) or a WURST pulse is used for at least one of the excitation pulse and the second excitation pulse.

14. The method according to claim 13, wherein a strength of the nuclear magnetic resonances with respect to their frequencies is determined by the magnetization device; and wherein the strength of the nuclear magnetic resonances with respect to their frequencies is normalized so that a frequency-dependent efficiency of the excitation of the nuclear magnetic resonances by at least one of the first excitation pulse and the second excitation pulse is compensated.

15. The method according to claim 9, wherein at least one of the first refocusing pulse and the second refocusing pulse is generated for rotating magnetic moments of the magnetized medium by angles of 45° or by angles of 180°; and wherein a hard, a soft, an adiabatic, a CHIRP (24) or a WURST pulse is used as at least one of the first refocusing pulse and second refocusing pulse.

16. The method according to claim 9, wherein the excitation signal includes a multi-echo pulse sequence;

wherein nuclear magnetic resonances excited by the multi-echo pulse sequence in the magnetized medium are measured and evaluated by determining at least one flow rate of the magnetized medium; and wherein the MMME pulse sequence is used as the multi-echo pulse sequence.

17. The method according to claim 9, wherein at least one of the first refocusing pulse and the second refocusing pulse are generated for rotating magnetic moments in the magnetized medium by angles of 180°.

* * * * *